(12) United States Patent
Lin et al.

(10) Patent No.: US 8,946,014 B2
(45) Date of Patent: Feb. 3, 2015

(54) FINFET DEVICE STRUCTURE AND METHODS OF MAKING SAME

(71) Applicant: Taiwan Semiconductor Manufacturing Company, Ltd., Hsin-Chu (TW)

(72) Inventors: Yu-Chao Lin, Hsin-Chu (TW); Yih-Ann Lin, Jhudong Township (TW); Ryan Chia-Jen Chen, Chiaya (TW); Chao-Cheng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/748,312

(22) Filed: Jan. 23, 2013

(65) Prior Publication Data
US 2014/0183661 A1 Jul. 3, 2014

Related U.S. Application Data

(60) Provisional application No. 61/746,858, filed on Dec. 28, 2012.

(51) Int. Cl.
*H01L 21/8234* (2006.01)
*H01L 27/088* (2006.01)

(52) U.S. Cl.
CPC .... *H01L 21/823431* (2013.01); *H01L 27/0886* (2013.01)
USPC .......................................................... 438/197

(58) Field of Classification Search
CPC ......... H01L 21/77; H01L 21/78; H01L 21/84; H01L 21/845
USPC ............................................................ 257/401
See application file for complete search history.

(56) References Cited

U.S. PATENT DOCUMENTS

| | | | |
|---|---|---|---|
| 8,003,485 B2 * | 8/2011 | Cho et al. | 438/424 |
| 8,586,449 B1 * | 11/2013 | Chang et al. | 438/432 |
| 8,592,918 B2 * | 11/2013 | Yuan et al. | 257/401 |
| 2007/0134884 A1 * | 6/2007 | Kim et al. | 438/424 |
| 2007/0284661 A1 * | 12/2007 | Yamada et al. | 257/347 |
| 2008/0048268 A1 * | 2/2008 | Hsu et al. | 257/365 |
| 2011/0081764 A1 * | 4/2011 | Maszara et al. | 438/413 |
| 2012/0199909 A1 * | 8/2012 | Schulz et al. | 257/351 |
| 2013/0115777 A1 * | 5/2013 | Tung et al. | 438/703 |

(Continued)

FOREIGN PATENT DOCUMENTS

KR 2006114446 * 11/2006

*Primary Examiner* — A. Sefer
(74) *Attorney, Agent, or Firm* — Slater & Matsil, L.L.P.

(57) ABSTRACT

Embodiments of the present disclosure are a method of forming a semiconductor device, a method of forming a FinFET device, a FinFET device. An embodiment a method for semiconductor device, the method comprising forming a first dielectric layer over a substrate, forming a first hardmask layer over the first dielectric layer, and patterning the first hardmask layer to form a first hardmask portion with a first width. The method further comprises forming a first raised portion of the first dielectric layer with the first width, wherein the first raised portion is aligned with the first hardmask portion, and forming a first spacer and a second spacer over the first dielectric layer, wherein the first spacer and the second spacer are on opposite sides of the first raised portion, and wherein the sidewalls of the first spacer and the second spacer are substantially orthogonal to the top surface of the substrate.

18 Claims, 15 Drawing Sheets

(56) References Cited

U.S. PATENT DOCUMENTS

| | | | |
|---|---|---|---|
| 2013/0217233 A1* | 8/2013 | Chang et al. | 438/702 |
| 2013/0316513 A1* | 11/2013 | BASKER et al. | 438/400 |
| 2014/0131776 A1* | 5/2014 | Ching et al. | 257/288 |

* cited by examiner

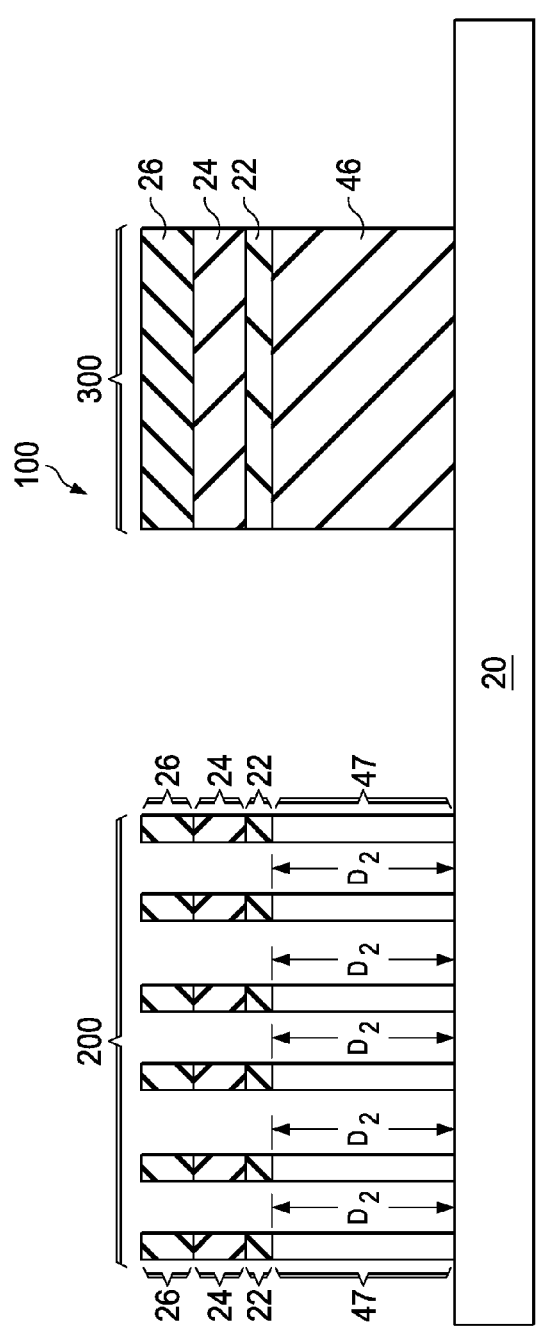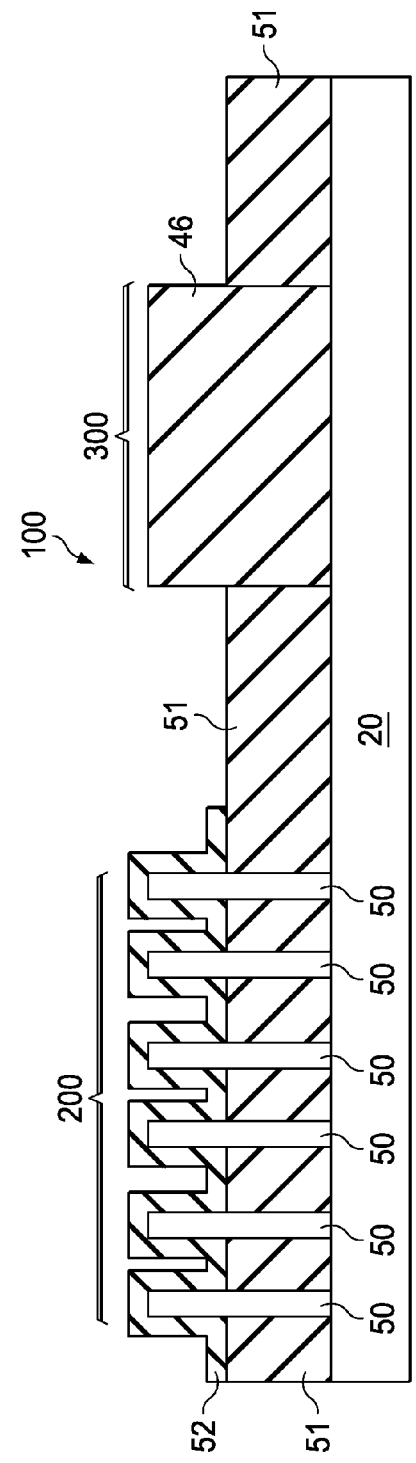

FINFET DEVICE STRUCTURE AND METHODS OF MAKING SAME

This application claims the benefit of the following provisionally filed U.S. patent application Ser. No. 61/746,858, filed Dec. 28, 2012, and entitled "FinFET Device Structure and Methods of Making Same," which application is hereby incorporated herein by reference.

BACKGROUND

Transistors are key components of modern integrated circuits. To satisfy the requirements of increasingly faster speed, the drive currents of transistors need to be increasingly greater. Since the drive currents of transistors are proportional to gate widths of the transistors, transistors with greater widths are preferred.

The increase in gate widths, however, conflicts with the requirements of reducing the sizes of semiconductor devices. Fin field-effect transistors (FinFET) were thus developed.

The introduction of FinFETs has the advantageous feature of increasing drive current without the cost of occupying more chip area. However, the small size of FinFET transistors raises numerous issues during their production and manufacturing.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 14 illustrates a second patterning of the substrate 20 in accordance with an embodiment;

FIG. 15 illustrates a formation of a sixth dielectric layer and a gate in accordance with an embodiment.

DETAILED DESCRIPTION OF ILLUSTRATIVE EMBODIMENTS

Figure 1:
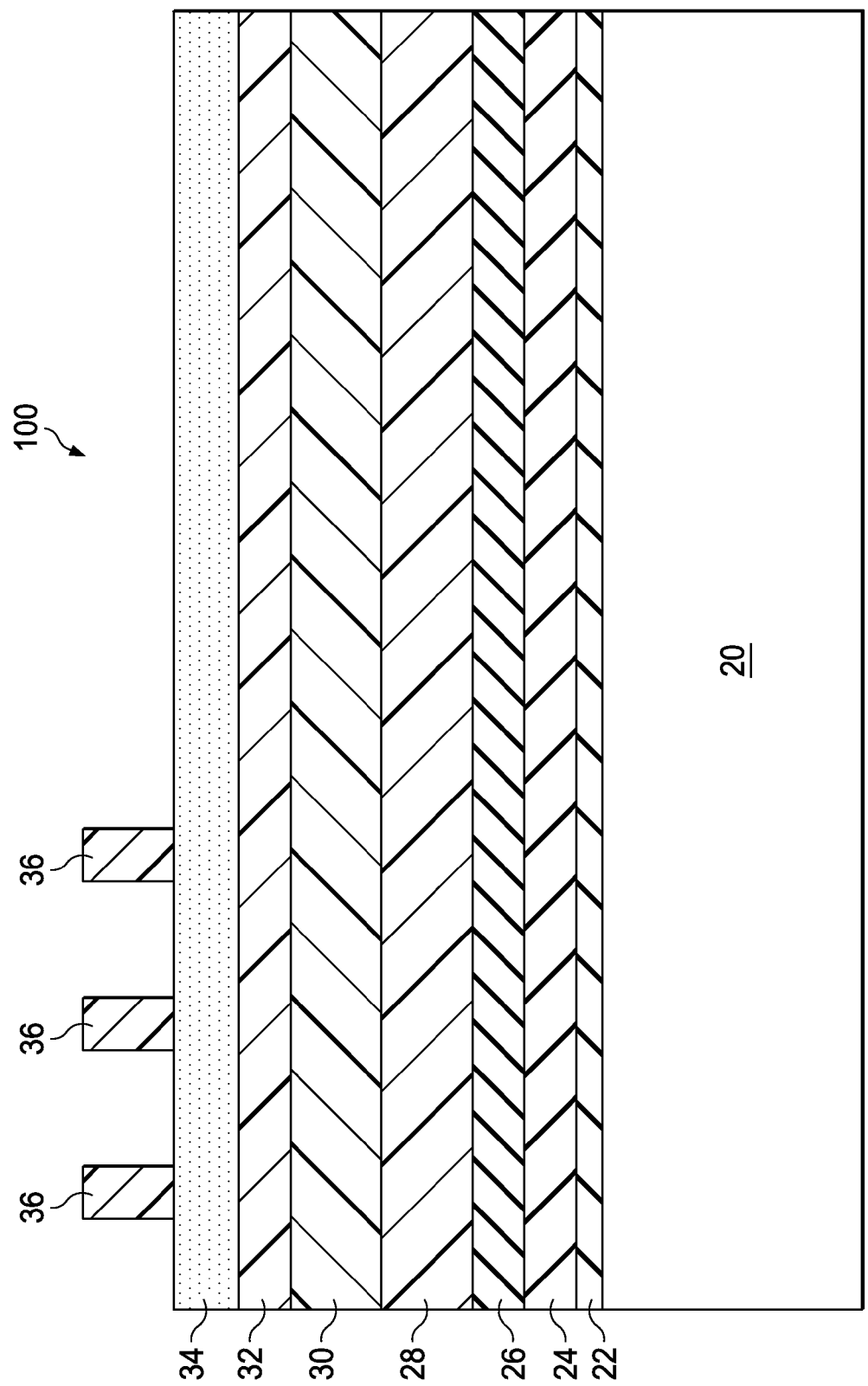
FIG. 1 illustrates a substrate with a first dielectric layer, a second dielectric layer, a third dielectric layer, a first hardmask layer, an APF layer, a second hardmask layer, and a BARC layer in accordance with an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a spacer mask for a FinFET device. Other embodiments may also be applied, however, to other spacer masks for other types of devices.

With reference to FIG. 1, there is shown a cross-sectional view of a FinFET device 100 at an intermediate stage of processing. The FinFET device 100 includes a substrate 20, a first dielectric layer 22, a second dielectric layer 24, a third dielectric layer 26, a first hardmask layer 28, an advanced patterning film (APF) layer 30, a second hardmask layer 32, a first bottom anti-reflective coating (BARC) layer 34, and a first photoresist 36 over the substrate 20. The substrate 20 may comprise a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 20 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 20 may be doped with a p-type dopant, such as boron, aluminum, gallium, or the like, although the substrate may alternatively be doped with an n-type dopant, as is known in the art.

The substrate 20 may include active devices (not shown in FIG. 1). As one of ordinary skill in the art will recognize, a wide variety of devices such as transistors, capacitors, resistors, combinations of these, and the like may be used to generate the structural and functional requirements of the design for the FinFET device 100. The devices may be formed using any suitable methods. Only a portion of the substrate 20 is illustrated in the figures, as this is sufficient to fully describe the illustrative embodiments.

The first dielectric layer 22 may be deposited over the substrate 20. The first dielectric layer 22 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The first dielectric layer 22 may be deposited through a process such as chemical vapor deposition (CVD), or a spin-on-glass process, although any acceptable process may be utilized to form the first dielectric layer 22 to a thickness between about 20 Å to about 80 Å. In an embodiment, the first dielectric layer 22 may be used as an etch stop layer (ESL) for subsequent processes.

The second dielectric layer 24 may deposited over the first dielectric layer 22. The second dielectric layer 24 may be formed of similar materials and similar processes as the first dielectric layer 22, although the first dielectric layer 22 and the second dielectric layer 24 need not be the same material. In an embodiment, the second dielectric layer 24 may be formed to a thickness between about 300 Å to about 500 Å.

The third dielectric layer 26 may deposited over the second dielectric layer 24. The third dielectric layer 26 may be used as an ESL for subsequent processes and may be formed of similar materials and similar processes as the first dielectric layer 22 and the second dielectric layer 24, although the first dielectric layer 22, the second dielectric layer 24, and the third dielectric layer 26 need not be the same materials. In an embodiment, the third dielectric layer 26 may be formed to a thickness between about 300 Å to about 700 Å. In some embodiments, the first dielectric layer 22, the second dielectric layer 24, and the third dielectric layer 26 may be a single dielectric layer rather than three separate layers.

The first hardmask layer 28 may be formed over the third dielectric layer 26. The first hardmask layer may be a masking material such as poly-silicon, silicon nitride, the like, or a combination thereof and may be formed using a process such as plasma enhanced chemical vapor deposition (PECVD). However, any other suitable hardmask material, such as silicon oxide, and any other process of formation, such as CVD, may alternatively be utilized. In an embodiment the first hardmask layer 28 may be formed to a thickness of between about 800 Å and about 1500 Å.

The APF layer 30 may be formed over the first hardmask layer 28 and may be utilized for critical dimension control in order to obtain and control the desired dimensions of the patterning of the first hardmask layer 28 (not shown in FIG. 1 but illustrated and discussed below with respect to FIG. 4). In an embodiment the APF layer 30 may comprise amorphous carbon formed by a CVD process, although other suitable materials and methods of formation may alternatively be utilized. The APF layer 30 may be formed to a thickness of between about 700 Å and about 1200 Å.

The second hardmask layer 32 may be a hardmask utilized to help pattern the APF layer 30, and may be a masking material such as silicon oxynitride, although other suitable materials, such as silicon oxide or silicon nitride, may alternatively be utilized, and may be formed a process such as CVD. However, any other suitable processes and thicknesses may alternatively be utilized. In an embodiment the second hardmask layer 32 may be formed to a thickness of between about 150 Å and about 400 Å.

The first BARC layer 34 may be formed over the second hardmask layer 32. The first BARC layer 34 prevents radiation in a subsequent photolithographic process to reflect off layers below and interfering with the exposure process. Such interference can increase the critical dimension of the photolithography process. The first BARC layer 34 may comprise SiON, a polymer, the like, or a combination thereof and may be formed by CVD, a spin-on process, the like, or a combination thereof within a lithography tool track. In an embodiment the first BARC layer 34 may be formed to a thickness of between about 400 Å and about 800 Å.

A first photoresist 36 may be deposited and patterned over the first BARC layer 34. Although FIG. 1 illustrates three separate sections of the first photoresist 36, there may be more or less sections depending on the number of semiconductor strips 49 and fins 50 (see FIGS. 14 and 15) that are desired. The first photoresist 36 may comprise a conventional photoresist material, such as a deep ultra-violet (DUV) photoresist, and may be deposited on the surface of the first BARC layer 34, for example, by using a spin-on process to place the first photoresist 36. However, any other suitable material or method of forming or placing the first photoresist 36 may alternatively be utilized. Once the first photoresist 36 has been placed on the first BARC layer 34, the first photoresist 36 may be exposed to energy, e.g. light, through a patterned reticle in order to induce a reaction in those portions of the first photoresist 36 exposed to the energy. The first photoresist 36 may then be developed, and portions of the first photoresist 36 may be removed, exposing a surface of the first BARC layer 34.

Figure 2:
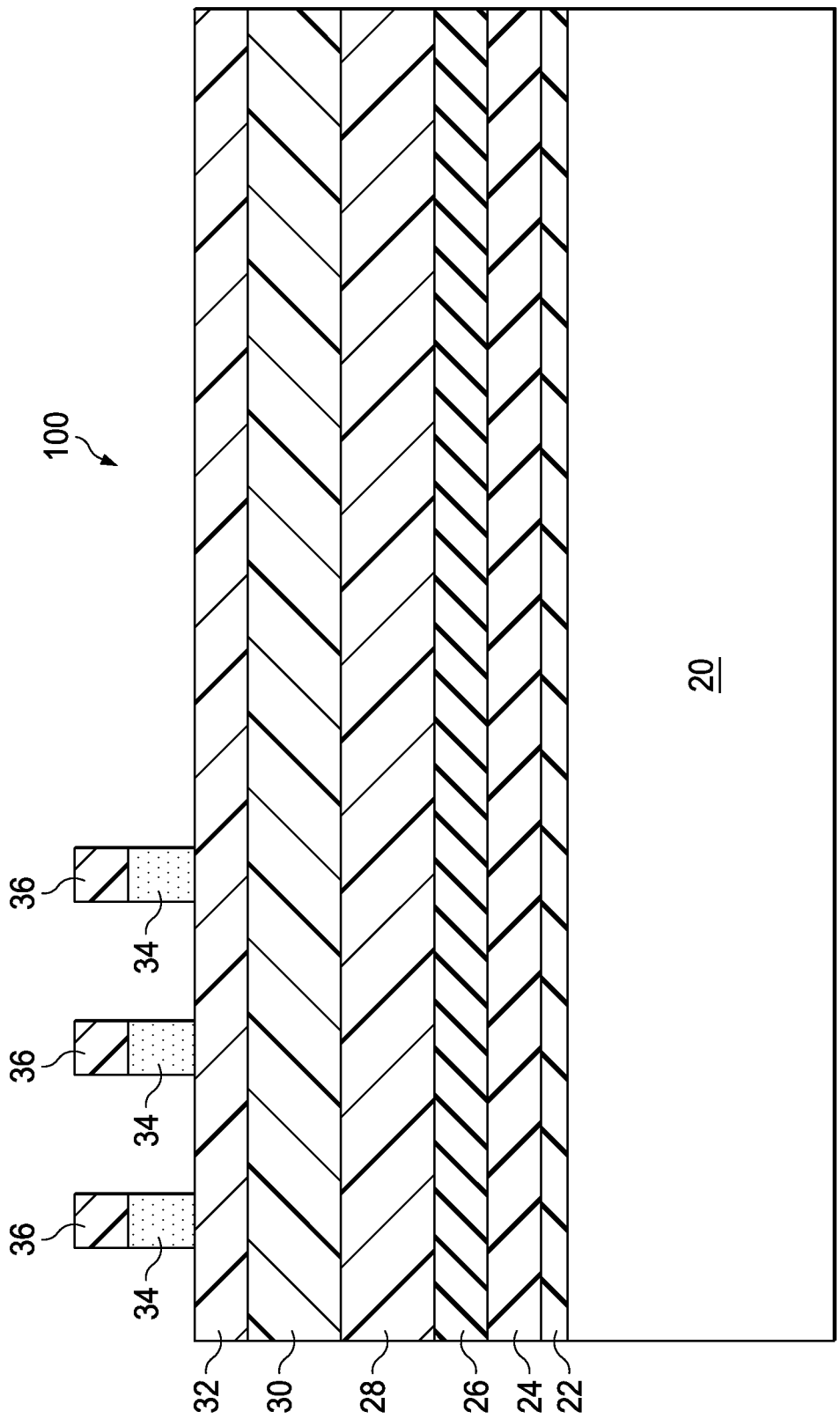
FIG. 2 illustrates a patterning of the BARC layer in accordance with an embodiment.
Figure 3:
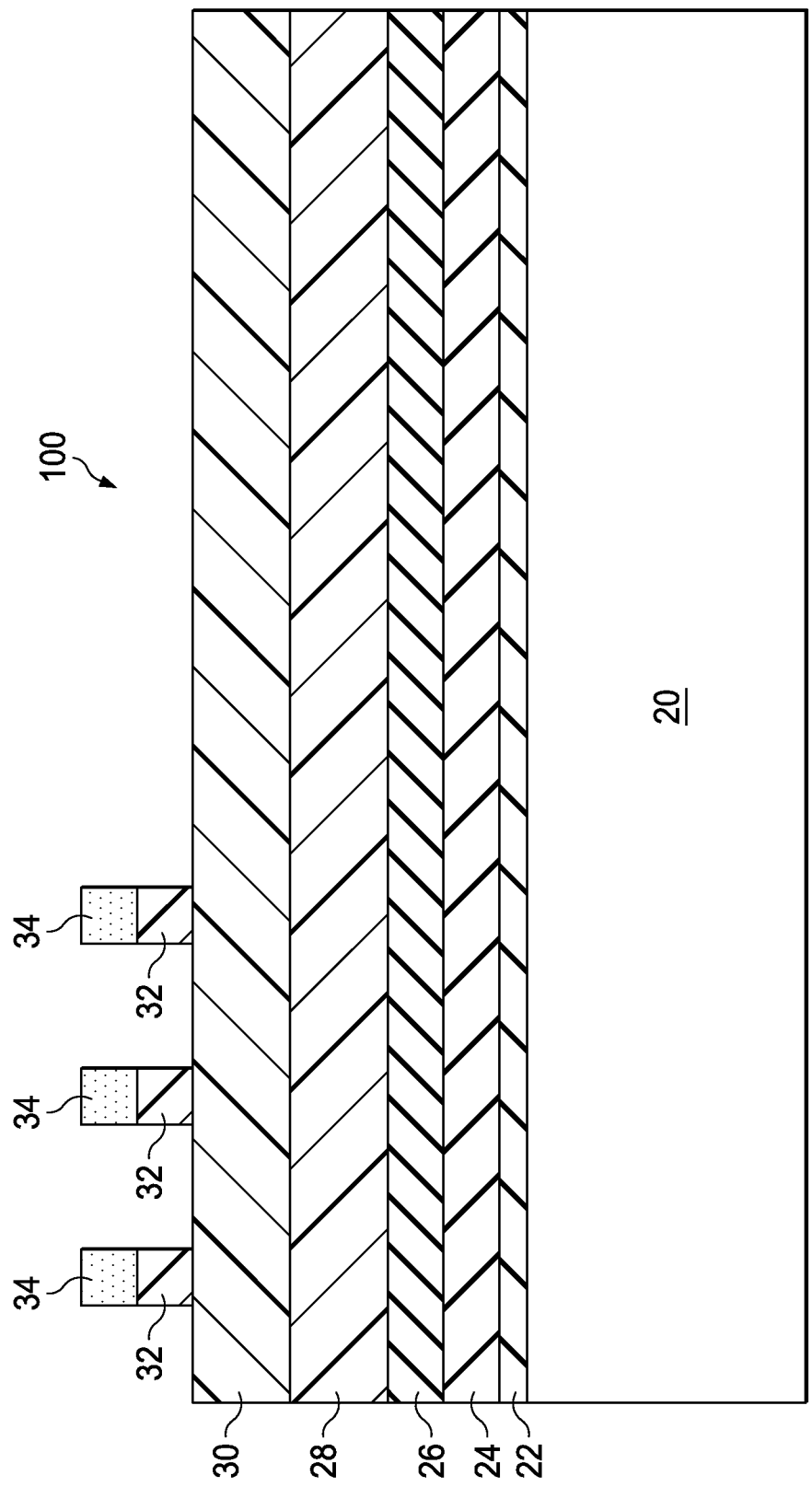
FIG. 3 illustrates a patterning of the second hardmask layer in accordance with an embodiment.

After developing and removing a portion of the first photoresist 36, an etch step is further performed into the first BARC layer 34 to remove the exposed portions, thereby patterning the BARC layer 34 as illustrated in FIG. 2. Once the first BARC layer 34 has been patterned, the pattern may be transferred to the second hardmask layer 32 as illustrated in FIG. 3.

Figure 4:
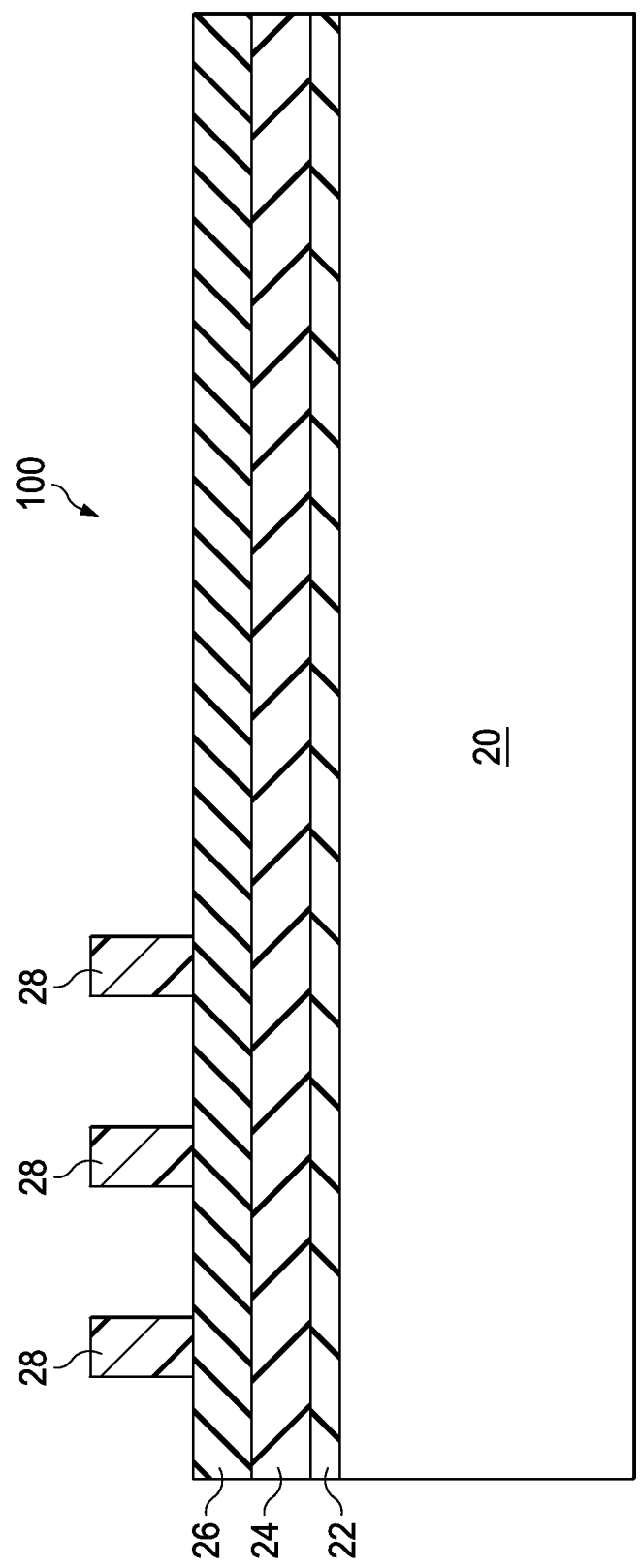
FIG. 4 illustrates a patterning of the APF layer and the first hardmask layer in accordance with an embodiment.

FIG. 4 illustrates the resulting structure after the pattern has been transferred to the APF layer 30 and the first hardmask layer 28. The pattern may be transferred to the APF layer 30 using, e.g., a dry etch using a mixture of H2/N2/CO. In an embodiment the transfer of the pattern may be performed using, e.g., a dry etch process, whereby reactive ions are directed towards the APF layer 30 with the overlying second hardmask 32. With the patterned second hardmask layer 32 overlying the APF layer 30, the patterned second hardmask 32 will block the reactive ions, thereby allowing reactions to occur where the APF layer 30 is exposed by the patterned second hardmask layer 32, thereby transferring the pattern of the second hardmask layer 32 to the APF layer 30.

After the APF layer 30 has been patterned, the pattern may be transferred from the APF layer 30 to the first hardmask layer 28. In an embodiment the transfer of the pattern may be performed using, e.g., a dry etch process, whereby reactive ions are directed towards the first hardmask layer 28 with the overlying patterned APF layer 30. With the patterned APF layer 30 overlying the first hardmask layer 28, the patterned APF layer 30 will block the reactive ions, thereby allowing reactions to occur where the first hardmask layer 28 is exposed by the patterned APF layer 30, thereby transferring the pattern of the APF layer 30 to the first hardmask layer 28.

Figure 5:
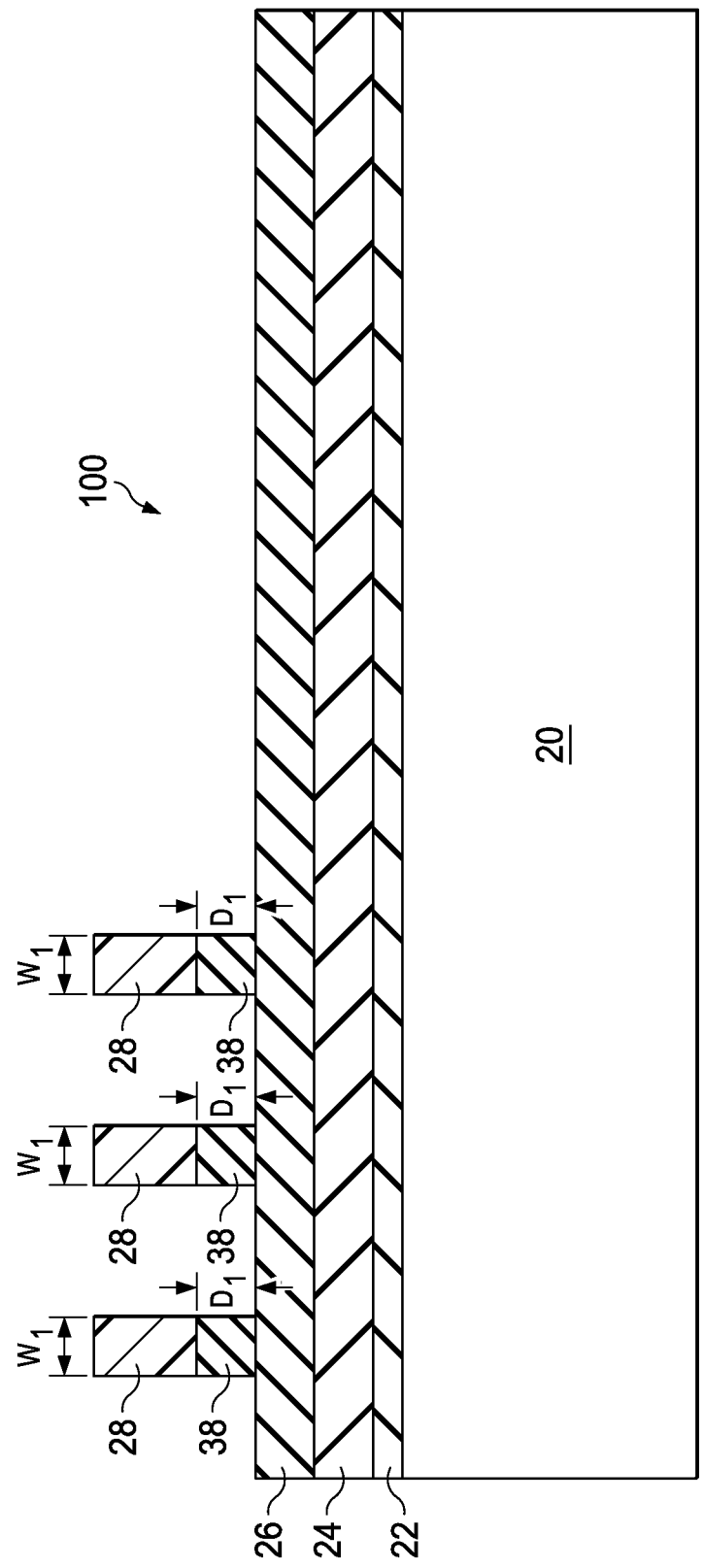
FIG. 5 illustrates a recessing of the third dielectric layer in accordance with an embodiment.

FIG. 5 illustrates the recessing of the exposed portions of the third dielectric layer 26 forming raised portions 38 of the third dielectric layer 26 directly under the remaining portions of the first hardmask layer 28. The raised portions 38 may support the subsequently formed fin spacers 42 during the etching of a fourth dielectric layer 40 and the removal of the first hardmask layer 28 (see FIGS. 7 and 8). In an embodiment, the third dielectric layer 26 may be recessed a depth $D_1$ between about 50 Å and about 150 Å and may have a width $W_1$ between about 10 nm and about 30 nm. The third dielectric layer 26 may be recessed in various ways such as a dry etch process, a wet clean process, a wet etch process, or a combination thereof. In a dry etch embodiment, the third dielectric layer 26 may be recessed by a plasma dry etch with etchant gas comprising $C_4F_8$, Ar, $O_2$, and He, or $CHF_3/He$, $CF_4/CH_2F_2$, $Cl_2/O_2$ or $HBr/O_2/He$, the like, or a combination thereof with a pressure between about 1 milliTorr (mT) and about 5 mT. In a wet clean embodiment, the third dielectric layer 26 may be recessed by a process comprising a diluted hydrofluoric acid (DHF) treatment, an ammonium peroxide mixture (APM), a sulfuric peroxide mixture (SPM), hot deionized water (DI water), the like, or a combination thereof for a time between about 10 seconds and about 90 seconds. In a wet etch embodiment, the third dielectric layer 26 may be recessed by a CERTAS® etch process comprising NH4 and HF with a pressure between about 5 mT and about 80 mT and a temperature between about 20° C. and about 60° C.

Figure 6:
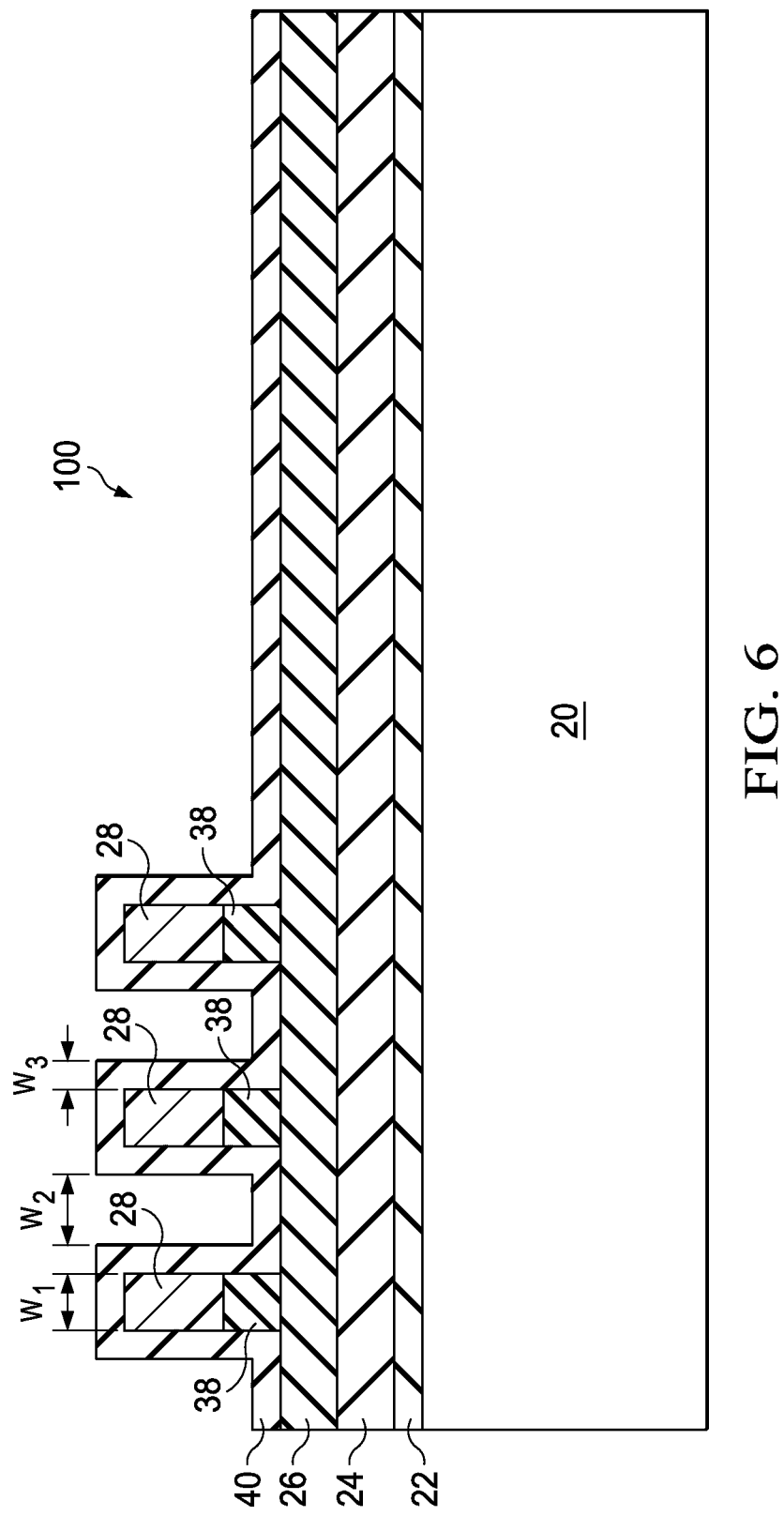
FIG. 6 illustrates the formation of a fourth dielectric in accordance with an embodiment.

FIG. 6 illustrates the formation of a fourth dielectric layer 40 over the third dielectric layer 26, the first hardmask portions 28, and the raised portions 38. In an embodiment, the fourth dielectric layer 40 may be conformally deposited over the third dielectric layer 26, the first hardmask portions 28, and the raised portions 38 such that the thickness of the fourth dielectric layer 40 on the top surface of the third dielectric layer 26, the sidewalls of the first hardmask portions 28, and the sidewalls of the raised portions 38 is substantially a same thickness. The fourth dielectric layer 40 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The fourth dielectric layer 40 may be deposited through a process such as atomic layer deposition (ALD), CVD, or a spin-on-glass process, although any acceptable process may be utilized to form the fourth dielectric layer 40 to a thickness $W_3$ between about 200 Å to about 300 Å. In some embodiments, the thickness $W_3$ may be designed such that the width $W_1$ is equal to width $W_2$. In an embodiment, the width $W_1$ and the width $W_2$ are between about 10 nm and about 30 nm.

Figure 7:
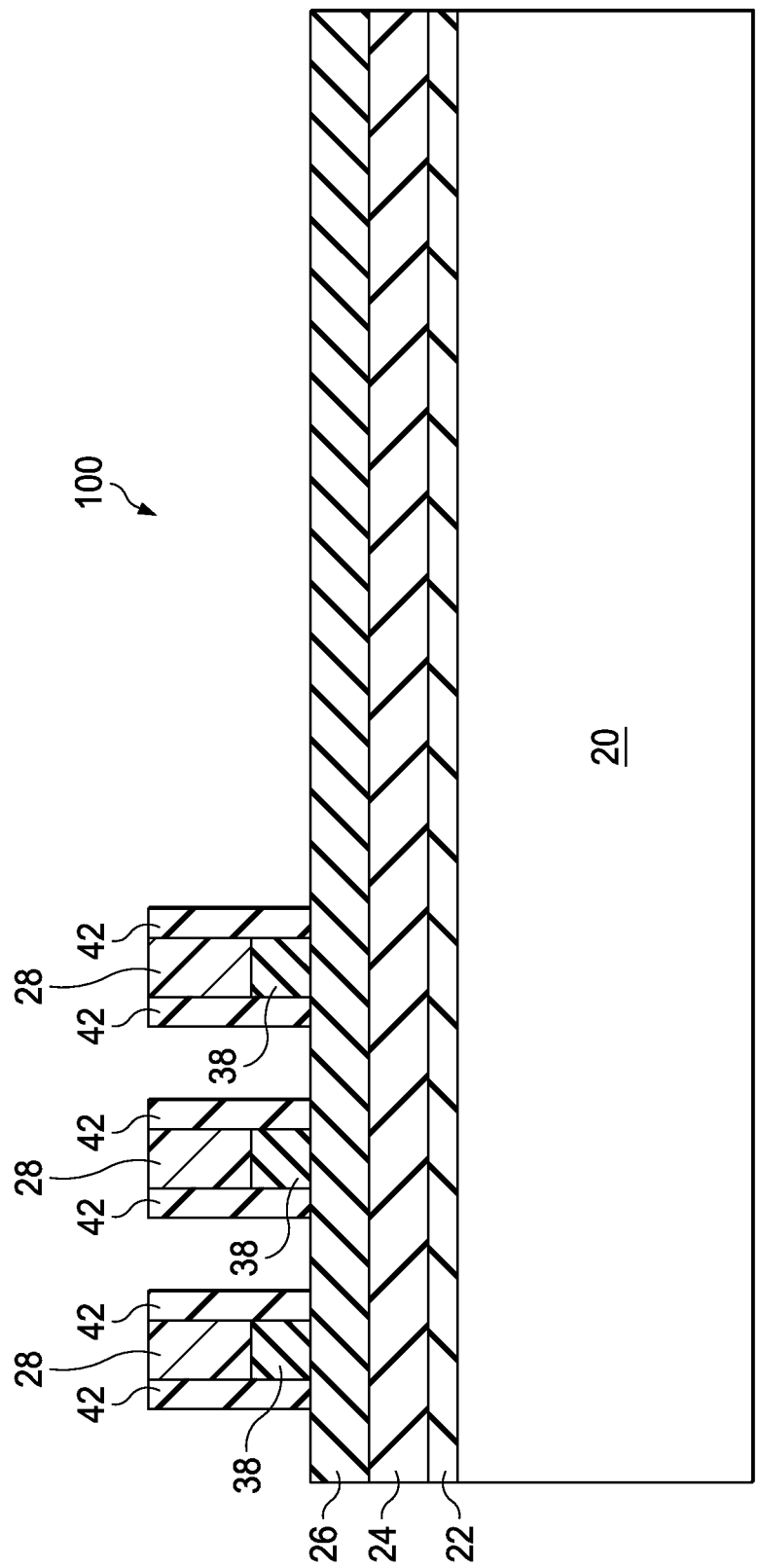
FIG. 7 illustrates a removal of a portion of the fourth dielectric layer in accordance with an embodiment.

FIG. 7 illustrates the etching of the fourth dielectric layer 40 to expose the first hardmask portions 28 and form fin spacers 42. The raised portions 38 and the first hardmask portions 28 form a mandrel to support the fin spacers and may help to prevent deformation of the fin spacers 42 during this etching step. The etching of the fourth dielectric layer 40 may be performed by, e.g., a dry etch, to remove the horizontal surfaces of the fourth dielectric layer. In an embodiment, the fourth dielectric layer 40 may be etched with etchant gas comprising $SF_6$, $CF_4$, $CHF_3$, the like, or a combination thereof with a pressure between about 3 mT and about 20 mT.

Figure 8:
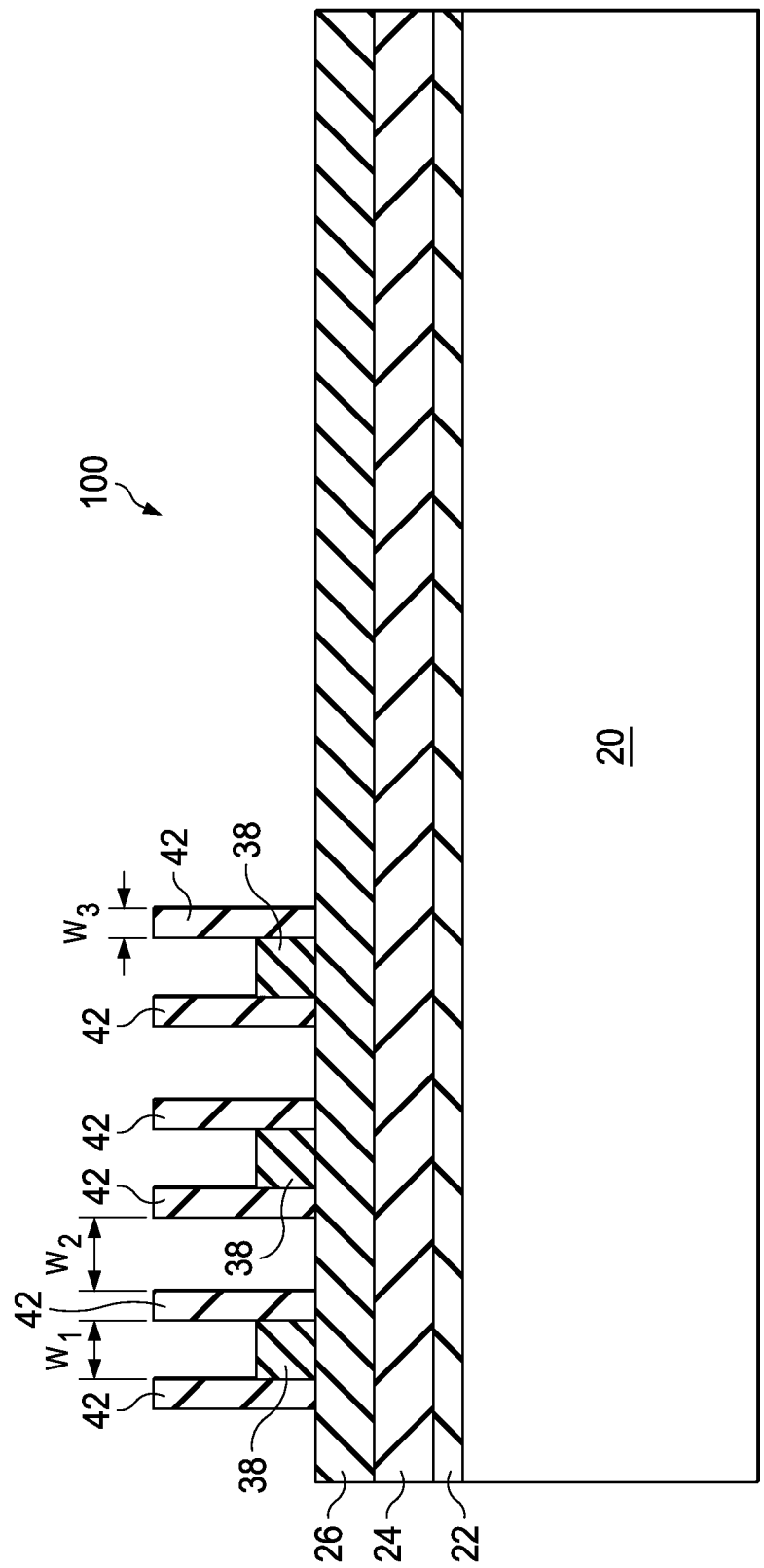
FIG. 8 illustrates the removal of the first hardmask layer in accordance with an embodiment.

After the fourth dielectric layer 40 is etched, the first hardmask portions 28 may be removed as illustrated in FIG. 8. The raised portions 38 form a mandrel to support the fin spacers 42 and may help to prevent deformation of the fin spacers 42 during the removal of the first hardmask portions 28. The removal of the first hardmask portions 28 may be performed by, e.g., a dry etch, to remove the first hardmask portions 28 from between the fin spacers 42. In an embodiment, the first hardmask portions 28 may be etched with etchant gas comprising $SF_6$, $CF_4$, $CHF_3$, $CH_2F_2$, $O_2$, $Cl_2$, He, the like, or a combination thereof with a pressure between about 3 mT to about 20 mT. In an embodiment, the fin spacers 42 may have sidewalls that are substantially orthogonal to the top surface of the substrate 20.

The width $W_1$ defines the width of a raised portion 38 and will later define the width of a first space between a pair of adjacent fins 50. The width $W_2$ defines the width between a pair of fin spacers 42, wherein each of the pair of fin spacers 42 adjoin different raised portions 38 and will later define the width of a second space between a pair of adjacent fins 50, the second space and the first space alternating between pairs of fins 50. The width $W_3$ defines the width of a fin spacer 42 and will later define the width of a fin 50.

Figure 9:
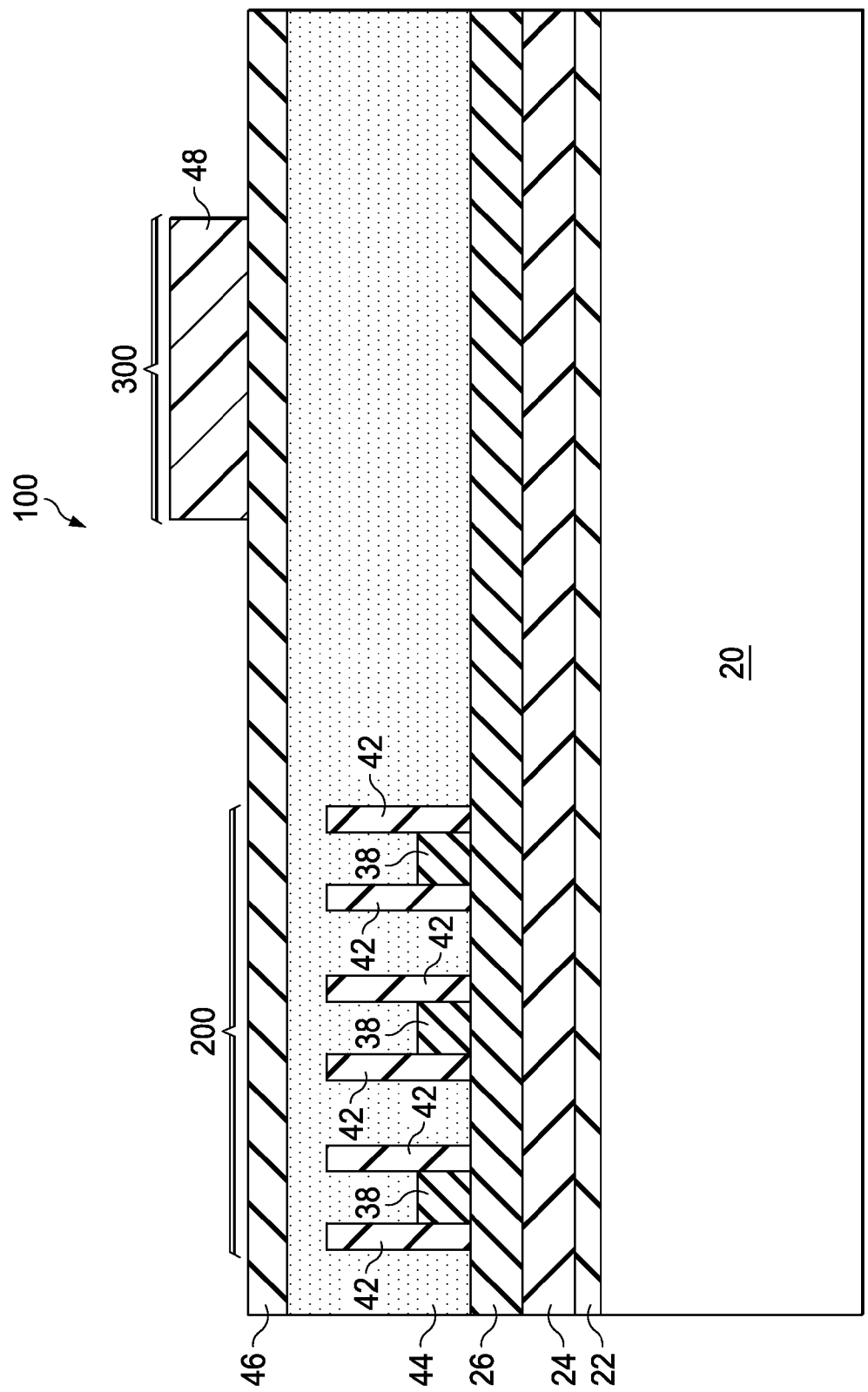
FIG. 9 illustrates the formation of a second BARC layer, a fifth dielectric layer, and a second photoresist in accordance with an embodiment.

FIG. 9 illustrates the formation of a second BARC layer 44, a fifth dielectric layer 46 and a second photoresist 48 over the fin spacers 42, the raised portions 38, and the third dielectric layer 26. The fin spacers 42 and the raised portions 38 comprise a first active region 200 and the second photoresist 48 is used to pattern a second active region 300. The second active region 300 may comprise a FinFET device, other active devices, passive devices, the like, or a combination thereof. The second BARC layer 44 may be formed of similar materials and similar processes as the first BARC layer 34, although the first BARC layer 34 and the second BARC layer 44 need not be the same material. In an embodiment, the second BARC layer 44 may be formed to a thickness between about 1800 Å to about 3000 Å.

The fifth dielectric layer 46 may be formed over the second BARC layer 44. The fifth dielectric layer 46 may be formed of similar materials and similar processes as the first dielectric layer 22, the second dielectric layer 24, the third dielectric layer 26, and the fourth dielectric layer 40, although the first dielectric layer 22, the second dielectric layer 24, the third dielectric layer 26, the fourth dielectric layer 40, and the fifth dielectric layer 46 need not be the same material. In an embodiment, the fifth dielectric layer 46 may be formed to a thickness between about 400 Å to about 600 Å.

The second photoresist 48 may be formed of similar materials and similar processes as the first photoresist 36, although the first photoresist 36 and the second photoresist 48 need not be the same material. The second photoresist 48 may then be developed, and portions of the second photoresist 48 may be removed, exposing a surface of the fifth dielectric layer 46.

Figure 10:
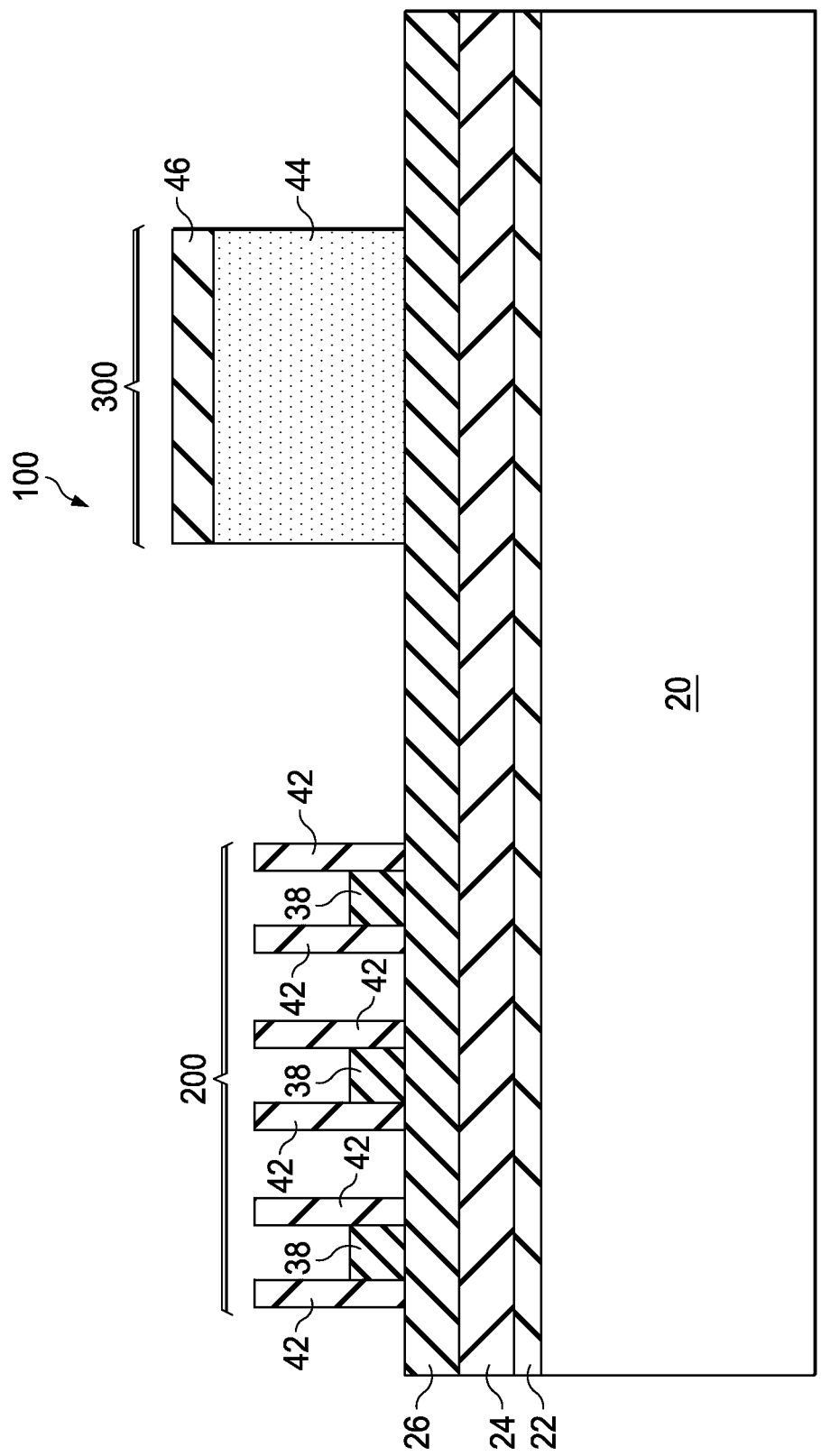
FIG. 10 illustrates the patterning of the fifth dielectric layer and the second BARC layer in accordance with an embodiment.

After developing and removing a portion of the second photoresist 48, an etch step is further performed into the fifth dielectric layer 46 to remove the exposed portions, thereby patterning the fifth dielectric layer 46 as illustrated in FIG. 10. Once the fifth dielectric layer 46 has been patterned, the pattern may be transferred to the second BARC layer 44, thereby exposing the fin spacers 42 and the raised portions 38.

Figure 11:
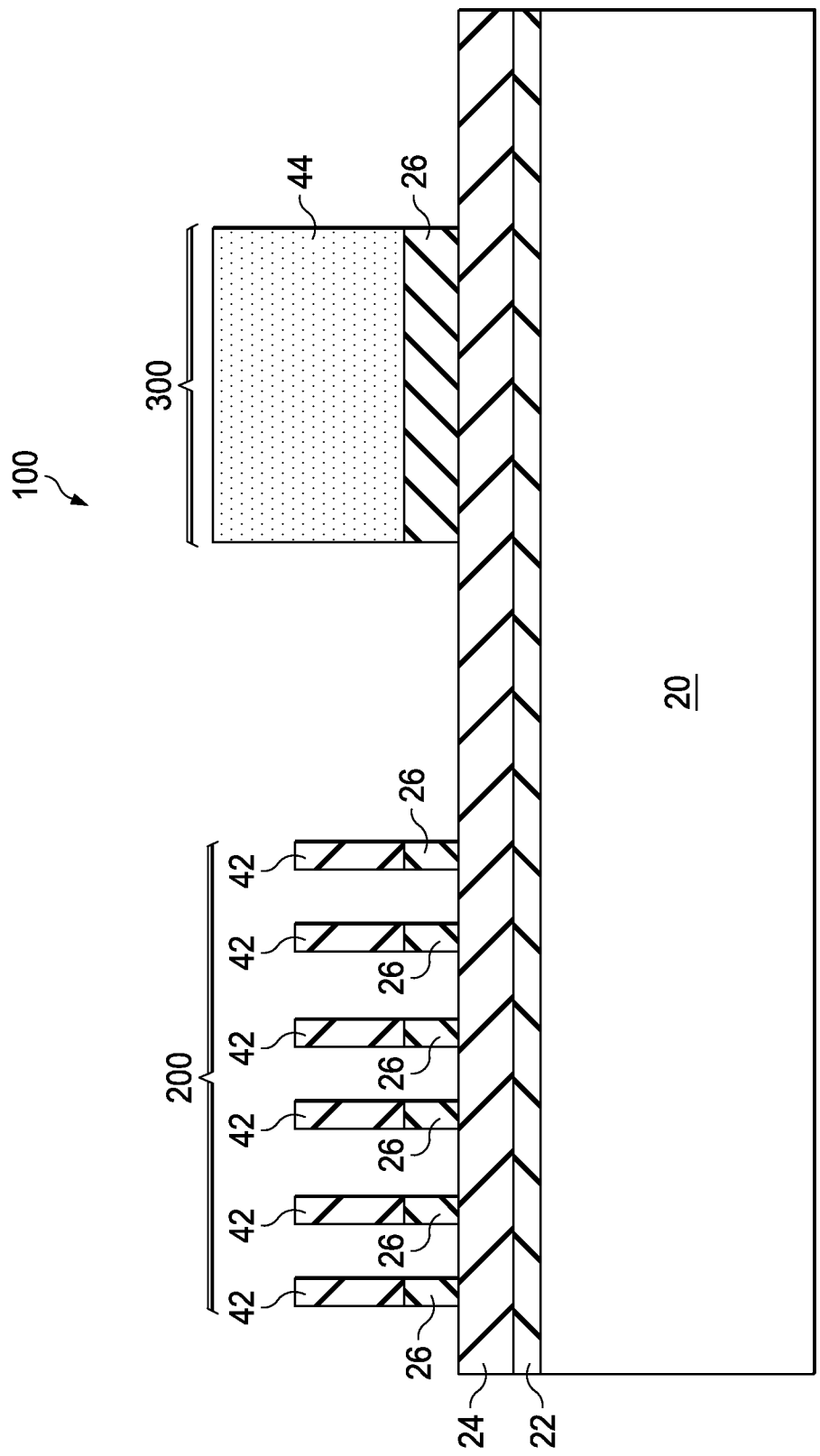
FIG. 11 illustrates a patterning of the third dielectric layer in accordance with an embodiment.

FIG. 11 illustrates the removal of the exposed portions of the third dielectric layer 26 and the raised portions 38, thereby transferring the pattern of the fin spacers 42 and the second active region 300 to the third dielectric layer 26. The etching of the third dielectric layer 26 may be performed by, e.g., a dry etch, with etchant gas comprising $SF_6$, $CF_4$, $CHF_3$, He, Ar, the like, or a combination thereof.

Figure 12:
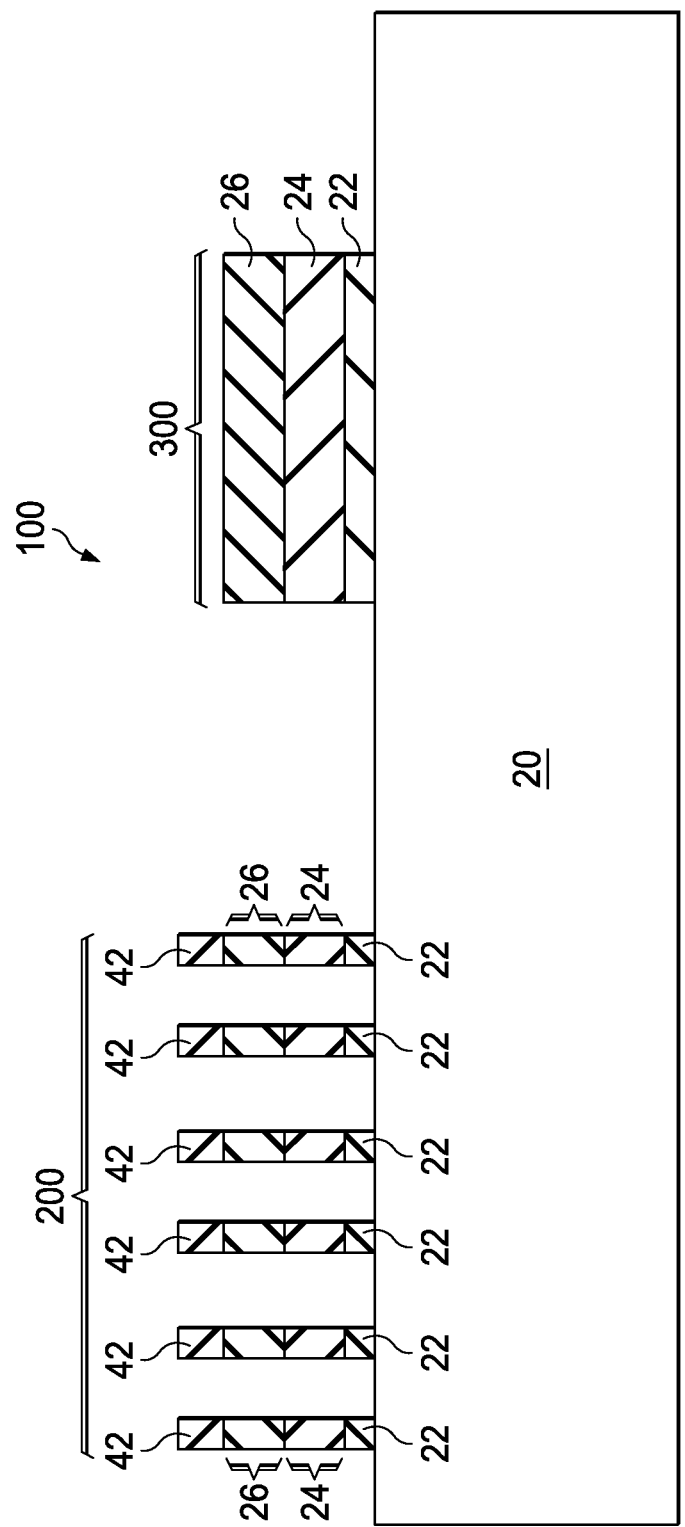
FIG. 12 illustrates a patterning of the second dielectric layer and the first dielectric layer in accordance with an embodiment.

FIG. 12 illustrates the removal of the exposed portions of the second dielectric layer 24 and the first dielectric layer 22, thereby transferring the pattern of the fin spacers 42 and the second active region 300 to the second dielectric layer 24 and the first dielectric layer 22. The etching of the second dielectric layer 24 and the first dielectric layer 22 may be performed by, e.g., a dry etch, with etchant gas comprising $SF_6$, $CF_4$, $CHF_3$, the like, or a combination thereof.

Figure 13:
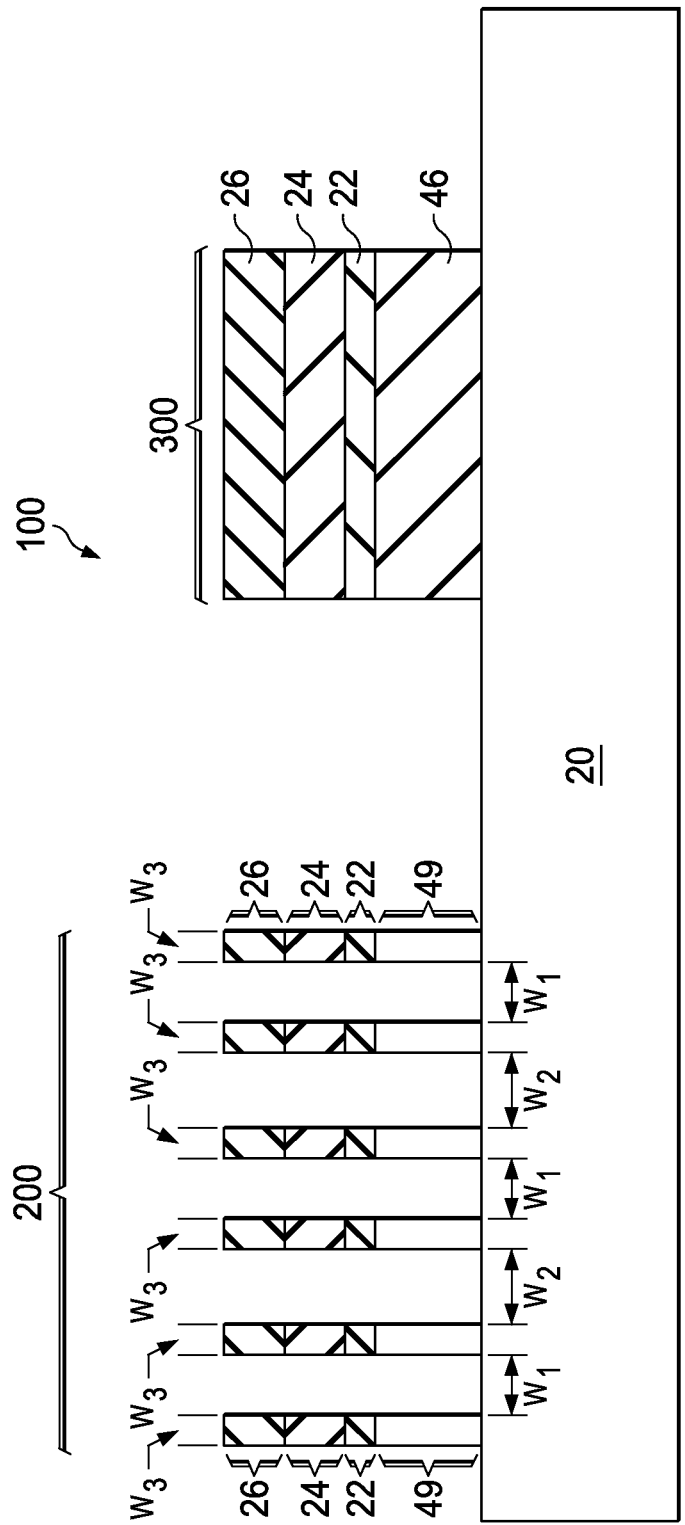
FIG. 13 illustrates a first patterning of the substrate 20 in accordance with an embodiment.

FIG. 13 illustrates the transferring of the pattern to the substrate 20, thereby forming semiconductor strips 49 extending from the substrate 20 in the first active region 200 and a semiconductor device 47 in the second active region 300. The semiconductor strips 49 may have sidewalls substantially orthogonal to a major surface of the substrate 20. The spacing between the semiconductor strips 49 $W_1$ and $W_2$ are defined by the width $W_1$ of the raised portions 38 and the width $W_2$ between the fin spacers 42 (see FIG. 8). In some embodiments, the width $W_1$ is substantially equal to the width $W_2$.

FIG. 14 illustrates further etching the substrate 20 to form the semiconductor strips 49 to a depth $D_2$. In an embodiment the depth $D_2$ may be between about 1000 Å and about 2500 Å. In some embodiments, the depths between the semiconductor strips 49 may be substantially equal.

FIG. 15 illustrates the formation of a sixth dielectric layer 51 over the semiconductor substrate, thereby forming fins 50 extending above a top surface of the sixth dielectric layer 51 and the formation of a gate 52 over the fins 50. The sixth dielectric layer 51 may be formed of similar materials and similar processes as the first dielectric layer 22, the second dielectric layer 24, the third dielectric layer 26, the fourth dielectric layer 40, and the fifth dielectric layer 46, although the first dielectric layer 22, the second dielectric layer 24, the third dielectric layer 26, the fourth dielectric layer 40, the fifth dielectric layer 46, and the sixth dielectric layer 51 need not be the same material.

The sixth dielectric layer 51 may be deposited over the semiconductor strips 49 such that the top surface of the sixth dielectric layer 51 may extend above the top surfaces of the semiconductor strips 49. In this embodiment, the sixth dielectric layer 51 may be thinned to below the level of the tops of the semiconductor strips 49. The sixth dielectric layer 51 may be thinned back in a variety of ways. In one embodiment, this is a multi-step process with the first step involving a chemical mechanical polishing (CMP), in which the sixth dielectric layer 51 is reacted and then ground away using an abrasive. This process may continue until the tops of the semiconductor strips 49 are exposed. The next step of thinning the sixth dielectric layer 51 below the tops of the semiconductor strips 49 may be performed in a variety of ways. One such way is by a DHF treatment or a vapor hydrofluoric acid (VHF) treatment for a suitable time. In another embodiment, the CMP process step may be skipped and the sixth dielectric layer 51 may be selectively thinned back without removing the semiconductor strips 49. This selective thinning may be performed by the DHF treatment or the VHF treatment described above.

After the formation of the sixth dielectric layer 51, the gate 52 may be formed over the fins 50. The gate 52 may include a gate dielectric layer (not shown) and gate spacers (not shown). The gate dielectric layer may be formed by thermal oxidation, CVD, sputtering, or any other methods known and used in the art for forming a gate dielectric. In other embodiments, the gate dielectric layer includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

A gate electrode layer (not shown) may be formed over the gate dielectric layer. The gate electrode layer may comprise a conductive material and may be selected from a group comprising polycrystalline-silicon (poly-Si), poly-crystalline silicon-germanium (poly-SiGe), metallic nitrides, metallic silicides, metallic oxides, and metals. The gate electrode layer may be deposited by CVD, sputter deposition, or other techniques known and used in the art for depositing conductive materials. The top surface of the gate electrode layer usually has a non-planar top surface, and may be planarized prior to patterning of the gate electrode layer or gate etch. Ions may or may not be introduced into the gate electrode layer at this point. Ions may be introduced, for example, by ion implantation techniques. The gate electrode layer and the gate dielectric layer may be patterned to form the gate 52. The gate patterning process may be accomplished by depositing mask material (not shown) such as photoresist or silicon oxide over the gate electrode layer. The mask material is then patterned and the gate electrode layer is etched in accordance with the pattern.

After the formation of the gate 52, source and drain regions (not shown) may be formed on the fins 50. The source and drain regions may be doped by performing implanting process to implant appropriate dopants to complement the dopants in the fins 50. In another embodiment, the source and drain regions may be formed by forming recesses (not shown) in fins 50 and epitaxially growing material in the recesses. The source and drain regions may be doped either through an implantation method as discussed above, or else by in-situ doping as the material is grown. In an embodiment, a continuous conductive layer may overly the fins 50 in each of the source regions to form a single source region. Further, a continuous conductive layer may overly the four fins 50 in each of the drain regions in each of the drain regions to form a single drain region.

Gate spacers (not shown) may be formed on opposite sides of the gates 52. The gate spacers are typically formed by blanket depositing a spacer layer (not shown) on the previously formed structure. The spacer layer may comprise SiN, oxynitride, SiC, SiON, oxide, the like, or a combination thereof and may be formed by methods utilized to form such a layer, such as CVD, plasma enhanced CVD, sputter, and other methods known in the art. The gate spacers are then patterned, preferably by anisotropically etching to remove the spacer layer from the horizontal surfaces of the structure.

In another embodiment, the source and drain regions may comprise a lightly doped region and a heavily doped region. In this embodiment, before the gate spacers are formed, the source and drain regions may be lightly doped. After the gate spacers are formed, the source and drain regions may then be heavily doped. This forms lightly doped regions and heavily doped regions. The lightly doped regions are primarily underneath the gate spacers while the heavily doped regions are outside of the gate spacers along the fins 50.

After the formation of the gate 52, subsequent processing of the FinFET device 100 may include formation of a contact etch stop layer (CESL), an inter-layer dielectric (ILD), and contacts in the ILD to the source and drain regions and the gate 52. Further contacts may be made in the ILD to the semiconductor device 47 in the second active region 300.

Figure 16:
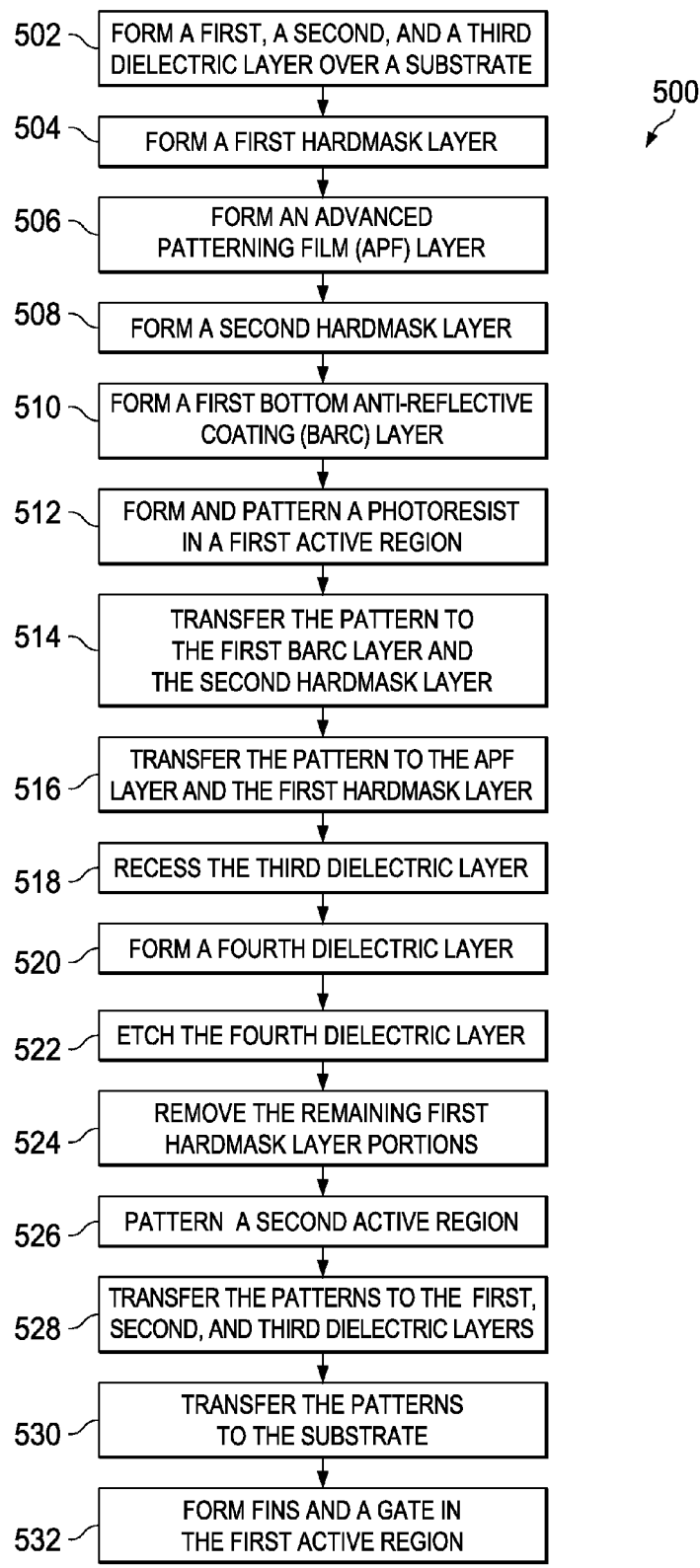
FIG. 16 illustrates a flow diagram of a method for manufacturing a FinFET device according to an embodiment.

FIG. 16 illustrates a flow diagram of a method 500 for manufacturing a FinFET device according to an embodiment. While method 500 is illustrated and described below as a series of acts or events, it will be appreciated that the illustrated ordering of such acts or events are not to be limited to a particular embodiment. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 502, a first dielectric layer, a second dielectric layer, and a third dielectric layer are formed over a substrate. At step 504, a first hardmask layer is formed over the third dielectric layer. At step 506, an APF layer is formed over the first hardmask layer. At step 508, a second hardmask layer is formed over the APF layer. At step 510, a first BARC layer is formed over the second hardmask layer. At step 512, a photoresist is formed and patterned over the first BARC layer in a first active region. Steps 502 through 512 are illustrated in FIG. 1.

At step 514, the pattern from the photoresist is transferred to the first BARC layer and the second hardmask layer. Step 514 is illustrated in FIGS. 2 and 3.

At step 516, the pattern is transferred to the APF layer and the first hardmask layer. Step 516 is illustrated in FIG. 4.

At step 518, the third dielectric layer is recessed to a first depth $D_1$ forming raised portions aligned with the remaining portion so the first hardmask layer. Step 518 is illustrated in FIG. 5.

At step 520, a fourth dielectric layer is formed over the remaining portion of the first hardmask layer, the raised portions of the third dielectric layer, and the third dielectric layer. Step 520 is illustrated in FIG. 6.

At step 522, the fourth dielectric layer is etched to remove the horizontal surfaces of the fourth dielectric layer forming fin spacers from the fourth dielectric layer. Step 522 is illustrated in FIG. 7.

At step 524, the remaining portions of the first hardmask layer are removed from between the fin spacers exposing the raised portions of the third dielectric layer. Step 524 is illustrated in FIG. 8.

At step 526, the second active region is patterned adjacent the first active region. This step includes forming and fifth dielectric layer and a second BARC layer. Step 526 is illustrated in FIGS. 9 and 10.

At step 528, the patterns from the first active region and the second active region are transferred to the third dielectric layer, the second dielectric layer, and the first dielectric layer. Step 528 is illustrated in FIGS. 11 and 12.

At step 530, the patterns are transferred to the substrate forming semiconductor strips in the first active region and a semiconductor device in the second active region. Step 530 is illustrated in FIGS. 13 and 14.

At step 532, the semiconductor strips are formed into fins and a gate is formed over the fins in the first active region. This step includes forming a sixth dielectric layer over the semiconductor strips, thinning the sixth dielectric layer to below the top surfaces of the semiconductor strips forming fins, and forming a gate over the fins. Step 532 is illustrated in FIG. 15.

By forming the mandrels comprising the raised portions 38 and the first hardmask portions 28 between the fin spacers 42, the fin spacers 42 are supported and deformation of the fin spacers 42 is prevented. By having fin spacers 42 that are not deformed and that have sidewalls that are substantially orthogonal to the top surface of the substrate, the spacing and depth between the later formed fins 50 is better controlled and may be substantially equal between all of the fins 50.

An embodiment a method for semiconductor device, the method comprising forming a first dielectric layer over a substrate, forming a first hardmask layer over the first dielectric layer, and patterning the first hardmask layer to form a first hardmask portion with a first width. The method further comprises forming a first raised portion of the first dielectric layer with the first width, wherein the first raised portion is aligned with the first hardmask portion, and forming a first spacer and a second spacer over the first dielectric layer, wherein the first spacer and the second spacer are on opposite sides of the first raised portion, and wherein the sidewalls of the first spacer and the second spacer are substantially orthogonal to the top surface of the substrate.

Another embodiment is a method of forming a FinFET device, the method comprising forming a first dielectric layer over a substrate, forming a first hardmask layer over the first dielectric layer, and patterning the first hardmask layer into a first plurality of strips, at least two of the first plurality of strips having a first width. The method further comprises recessing the first dielectric layer, thereby forming a plurality of raised portions of the first dielectric layer, the plurality of raised portions having a first height, wherein the plurality of raised portions are aligned with the first plurality of strips, conformally depositing a second dielectric layer over the first dielectric layer, the first plurality of strips, and the plurality of raised portions, and removing the horizontal surfaces of the second dielectric layer, wherein top surfaces of the first plurality of strips are exposed, thereby forming a second plurality of strips of the second dielectric layer, the second plurality of strips having a second width.

Yet another embodiment is a FinFET device comprising a first semiconductor fin extending above a substrate, the first semiconductor fin having a first width, a second semiconductor fin extending above the substrate, the second semiconductor fin having the first width, and a first recess laterally between the first semiconductor fin and the second semiconductor fin, the first recess having a second width and a first height. The FinFET device further comprises a third semiconductor fin extending above the substrate, the third semiconductor fin having the first width, and a second recess laterally between the second semiconductor fin and the third semiconductor fin, the second recess having the second width and the first height.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
   forming a first dielectric layer over a substrate
   forming a first hardmask layer over the first dielectric layer;
   patterning the first hardmask layer to form a first hardmask portion with a first width;
   forming a first raised portion of the first dielectric layer with the first width, wherein the first raised portion is aligned with the first hardmask portion;
   forming a first spacer and a second spacer over the first dielectric layer, wherein the first spacer and the second spacer are on opposite sides of the first raised portion, and wherein the sidewalls of the first spacer and the second spacer are substantially orthogonal to a top surface of the substrate, wherein the forming the first spacer and the second spacer further comprises:
      forming a second dielectric layer over the first dielectric layer, the first hardmask portion, and the first raised portion; and
      removing the horizontal surfaces of the second dielectric layer, wherein top surfaces of the first hardmask portion the first dielectric layer are exposed; and
   removing the first hardmask portion, wherein a top surface of the first raised portion is exposed.

2. The method of claim 1, wherein the forming the first raised portion of the first dielectric layer comprises recessing the first dielectric layer.

3. The method of claim 1, wherein a top surface of the first raised portion of the first dielectric layer extends above a top surface of the first dielectric layer between about 50 Angstroms and 150 Angstroms.

4. The method of claim 1, wherein the forming the second dielectric layer comprises conformally depositing the second dielectric layer over the first dielectric layer, the first hardmask portion, and the first raised portion.

5. The method of claim 1, wherein the patterning the first hardmask layer further comprises:
   forming an advanced patterning film (APF) layer over the first hardmask layer;
   forming a third dielectric layer over the APF layer;
   forming a photoresist over the third dielectric layer;
   patterning the photoresist to form a first photoresist portion with the first width;
   patterning the third dielectric layer to form a first portion of the third dielectric layer with the first width;
   patterning the APF layer to form a first portion of the APF layer with the first width; and
   transferring the pattern to the first hardmask layer.

6. The method of claim 1 further comprising:
   etching the first dielectric layer, wherein remaining portions of the first dielectric layer are aligned with the first and second spacers; and
   etching the substrate to form fins, wherein the fins are substantially aligned with the first and second spacers, and wherein the fins are separated by the first width.

7. The method of claim 6 further comprising:
   forming a gate dielectric layer over the fins;
   forming a gate over the gate dielectric layer; and
   forming source regions and drain regions on the fins, wherein the gate is laterally between the source regions and drain regions.

8. The method of claim 1 further comprising:
   patterning the first hardmask layer to form a second hardmask portion of the first width and a third hardmask portion of the first width;
   forming a second raised portion of the first dielectric layer with the first width, wherein the second raised portion is aligned with the second hardmask portion;
   forming a third raised portion of the first dielectric layer with the first width, wherein the third raised portion is aligned with the third hardmask portion;
   forming a third spacer and a fourth spacer over the first dielectric layer, wherein the third spacer and the fourth spacer are on opposite sides of the second raised portion, and wherein the sidewalls of the third spacer and the fourth spacer are substantially orthogonal to a top surface of the substrate; and
   forming a fifth spacer and a sixth spacer over the first dielectric layer, wherein the fifth spacer and the sixth spacer are on opposite sides of the third raised portion, and wherein the sidewalls of the fifth spacer and the sixth spacer are substantially orthogonal to a top surface of the substrate.

9. A method of forming a FinFET device, the method comprising:
   forming a first dielectric layer over a substrate;
   forming a first hardmask layer over the first dielectric layer;
   patterning the first hardmask layer into a first plurality of strips, at least two of the first plurality of strips having a first width;
   recessing the first dielectric layer, thereby forming a plurality of raised portions of the first dielectric layer, the plurality of raised portions having a first height, wherein the plurality of raised portions are aligned with the first plurality of strips;
   conformally depositing a second dielectric layer over the first dielectric layer, the first plurality of strips, and the plurality of raised portions; and
   removing the horizontal surfaces of the second dielectric layer, wherein top surfaces of the first plurality of strips are exposed, thereby forming a second plurality of strips of the second dielectric layer, the second plurality of strips having a second width.

10. The method of claim 9, wherein the second plurality of strips are adjoining the first plurality of strips.

11. The method of claim 9, wherein each of the plurality of raised portions are laterally between and adjoining a pair of strips of the second plurality of strips.

12. The method of claim 9 further comprising forming a plurality of fins having the second width, wherein a width between adjacent fins is the first width.

13. The method of claim 12, wherein the forming the plurality of fins further comprises:
   removing the first plurality of strips;
   etching the first dielectric layer and the plurality of raised portions, wherein remaining portions of the first dielectric layer are aligned with the second plurality of strips; and
   etching the substrate, wherein the fins are aligned with the remaining portions of the first dielectric layer.

14. The method of claim 12, further comprising:
   forming a gate dielectric layer over the fins;
   forming a gate over the gate dielectric layer; and
   forming source regions and drain regions on the fins, wherein the gate is laterally between the source regions and drain regions.

15. The method of claim 9, wherein the first plurality of strips comprises poly-silicon and the second plurality of strips comprises silicon nitride.

16. The method of claim 9, wherein the first height is between about 50 Angstroms and 150 Angstroms.

17. A method comprising:
   forming a first etch stop layer over a substrate;
   forming a first hardmask layer over the first etch stop layer;
   patterning the first hardmask layer into at least two strips having a first width;
   recessing the first etch stop layer to form at least two raised portions of the first etch stop layer aligned with the at least two strips; and
   forming spacers on opposite sidewalls of each of the at least two strips and the at least two raised portions, each of the spacers having second width; and
   patterning the substrate using the spacers as a mask to form at least two fins having the second width, wherein a width between adjacent fins is the first width.

18. The method of claim 17 further comprising:
   forming a gate dielectric layer over the at least two fins;
   forming a gate over the gate dielectric layer; and
   forming source regions and drain regions on the at least two fins, wherein the gate is laterally between the source regions and drain regions.

* * * * *